United States Patent [19]

Kishi et al.

[11] Patent Number: 5,038,183
[45] Date of Patent: Aug. 6, 1991

[54] DIODE USED IN REFERENCE POTENTIAL GENERATING CIRCUIT FOR DRAM

[75] Inventors: Koichi Kishi, Kawasaki; Soichi Sugiura, Yamato, both of Japan

[73] Assignee: Kabushiki Kaisha Toshiba, Kawasaki, Japan

[21] Appl. No.: 540,272

[22] Filed: Jun. 19, 1990

[30] Foreign Application Priority Data

Jun. 20, 1989 [JP] Japan ................................. 1-157162

[51] Int. Cl.⁵ .................... H01L 29/90; H01L 27/04; H01L 29/04; H01L 49/02
[52] U.S. Cl. ........................................ 357/13; 357/48; 357/4; 357/50; 357/59
[58] Field of Search ................... 357/12, 13, 48, 59

[56] References Cited

U.S. PATENT DOCUMENTS

| | | | |
|---|---|---|---|
| 3,953,254 | 4/1976 | Valdman | 357/13 |
| 4,349,394 | 9/1982 | Wei | 357/13 |
| 4,429,324 | 1/1984 | Wilkens | 357/13 |
| 4,831,424 | 5/1989 | Yoshida et al. | 357/13 |
| 4,870,469 | 9/1989 | Nishizawa et al. | 357/12 |
| 4,876,580 | 10/1989 | Nishizawa | 357/12 |

OTHER PUBLICATIONS

"VLSI Technology", S. M. Sze, 1988, FIG. 10 p. 33.

Primary Examiner—Rolf Hille
Assistant Examiner—Mahshid Saadat
Attorney, Agent, or Firm—Banner, Birch, McKie & Beckett

[57] ABSTRACT

A p-type impurity diffusion layer is formed in a major surface region of an n-type silicon substrate. An insulating film is formed on the substrate, and a contact hole is formed in the insulating film at a position corresponding to the impurity diffusion layer. An n-type polysilicon layer is formed inside the contact hole. The p-type impurity diffusion layer and the n-type polysilicon layer constitute a diode. A p-n junction of the diode is formed on the major surface of the substrate or in the polysilicon layer above the major surface.

16 Claims, 5 Drawing Sheets

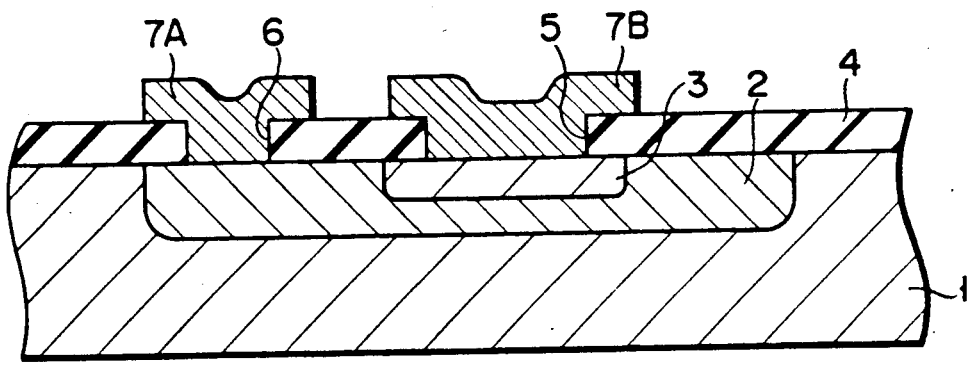
FIG. 1
(PRIOR ART)
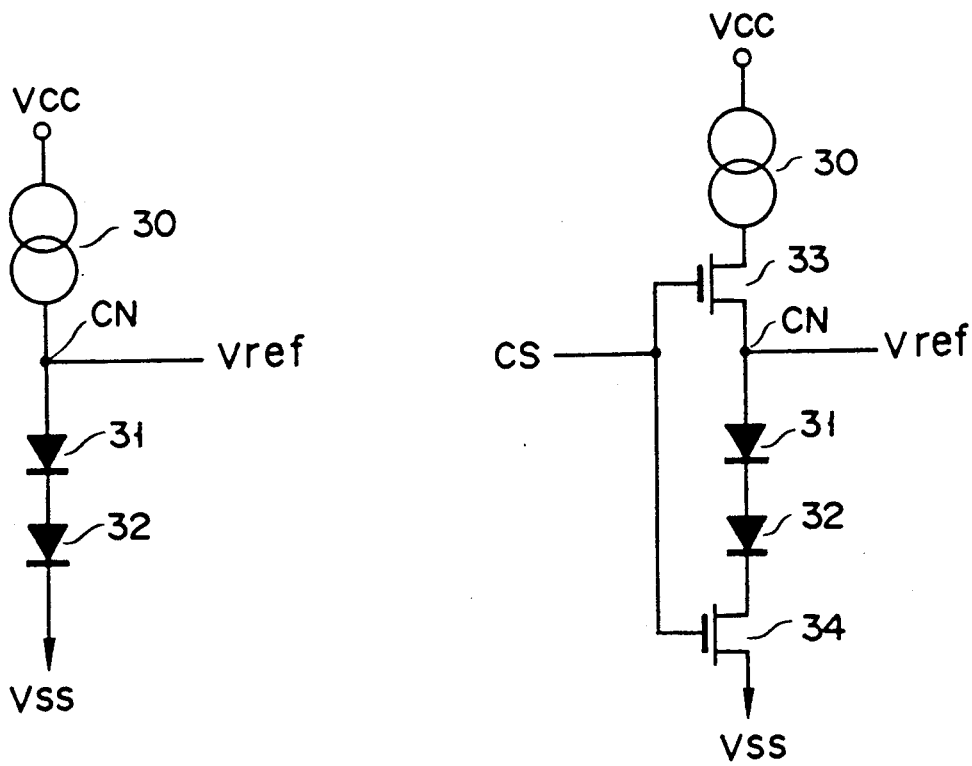
FIG. 2
FIG. 3

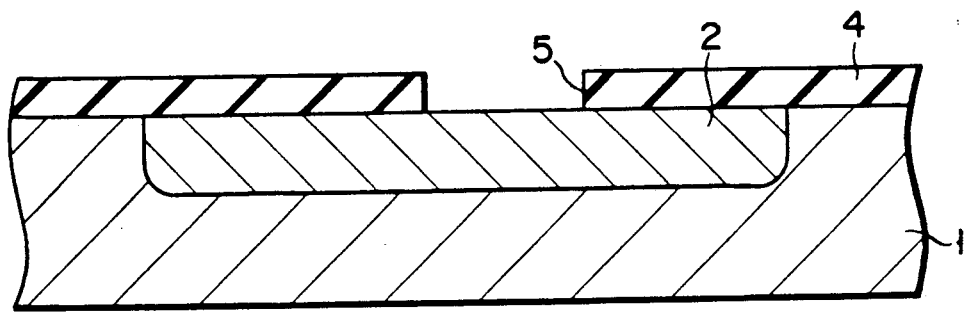
F I G. 6A
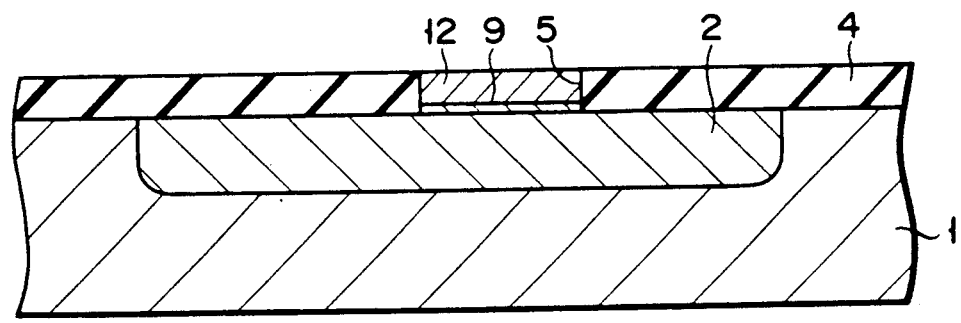
F I G. 6B
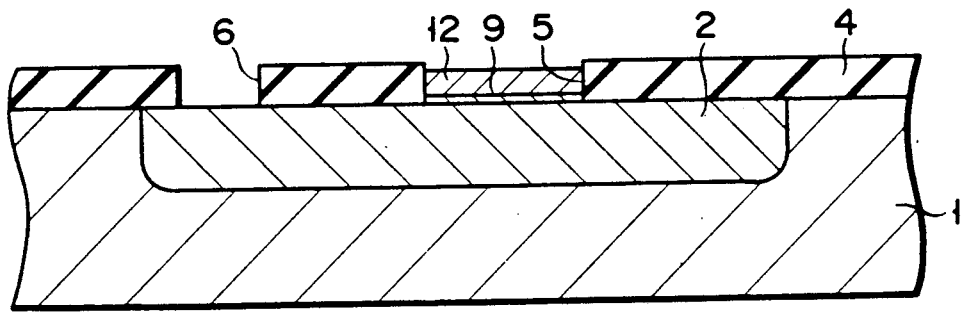
F I G. 6C

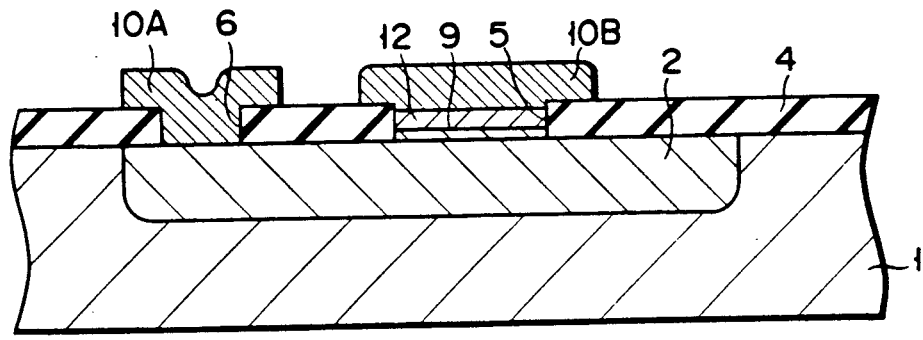
F I G. 6D
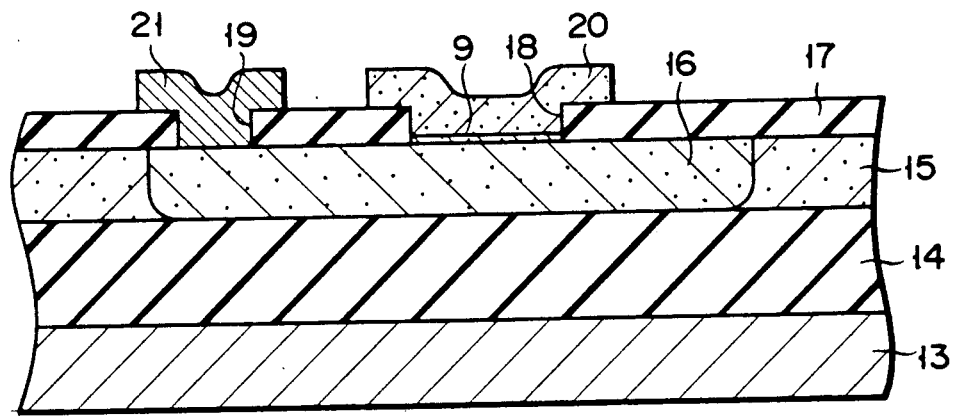
F I G. 7

DIODE USED IN REFERENCE POTENTIAL GENERATING CIRCUIT FOR DRAM

BACKGROUND OF THE INVENTION

1. Field of the Invention

The present invention relates to a diode such as a diode used in a reference potential generating circuit for a DRAM.

2. Description of the Related Art

A conventional reference potential generating circuit for a DRAM comprises a diode having an arrangement as shown in FIG. 1. More specifically, in a major surface region of an n-type silicon substrate 1, a p-type diffusion layer 2 containing boron ions as a p-type impurity is formed. The p-type diffusion layer 2 has a depth of e.g., about 0.3 μm from the major surface 1 of the substrate 1, and an impurity concentration of $10^{19}$ atoms·cm$^{-3}$ or more. In the p-type diffusion layer 2, an n-type diffusion layer 3 containing arsenic ions as an n-type impurity is formed. The n-type diffusion layer 3 has a depth of e.g., about 0.2 μm from the major surface of the substrate 1, and an impurity concentration of $10^{19}$ atoms·cm$^{-3}$ or more (in general, since the diffusion layer 3 is formed by doping an impurity in the diffusion layer 2, the diffusion layer 3 has a higher impurity concentration than that of diffusion layer 2). On the silicon substrate 1, an insulating film 4 is formed. The insulating film 4 has a thickness of about 1 to 2 μm. A first contact hole 5 is formed in the insulating film 4 at a position corresponding to the n-type diffusion layer 3. A second contact hole 6 is formed in part of a region on the p-type diffusion layer 2. In the first and second contact holes 5 and 6 and on parts of a region on the insulating film 4 around the contact holes 5 and 6, wiring patterns 7A and 7B consisting of e.g., aluminum are formed to be in contact with the p-type diffusion layer 2 and the n-type diffusion layer 3, respectively.

In a diode having such a structure, a voltage, a so-called forward dropping voltage .VF, is generated between p-type silicon and n-type silicon when a forward current flows between the wiring patterns 7A and 7B respectively contacting the p-type diffusion layer 2 and the n-type diffusion layer 3. The voltage VF depends on impurity concentrations of p-type silicon and n-type silicon i.e., the p-type diffusion layer 2 and the n-type diffusion layer 3, and has less temperature dependency. In this aspect, the voltage VF generated by the diode is suitable for generating a reference potential, and is used in a reference potential generating circuit for a DRAM or the like.

Recently, higher integration of many types of semiconductor devices such as a DRAM has been achieved. As higher integration or element micropatterning is achieved, a diffusion layer having a small depth from the major surface of the substrate 1 and a high impurity concentration is required. As a result, with the development of element micropatterning, a p-n junction having a small diffusion depth and a high impurity concentration is formed inside the semiconductor device. The diode described above also has this tendency. The diffusion depth of the p-type diffusion layer 2 from the major surface of the substrate 1 is about 0.3 μm, and that of the n-type diffusion layer 3 is about 0.2 μm. The impurity concentrations of these two diffusion layers are $10^{19}$ atoms·cm$^{-3}$ or more. When the n-type diffusion layer 3 is formed in the shallow p-type diffusion layer 2, a shallow p-n junction is formed. When the shallow p-n junction is formed, erosion of silicon by a wiring material e.g., aluminum, constituting the wiring patterns 7A and 7B, a so-called aluminum spike becomes a serious problem. An aluminum spike is a phenomenon wherein aluminum reacts with silicon and aluminum punches through a diffusion layer to reach a substrate. When the aluminum spike occurs in a diode as shown in FIG. 1, aluminum constituting the wiring pattern 7B punches through the n-type diffusion layer 3, and reaches the p-type diffusion layer 2 to cause a short circuit. To avoid this problem, the p-type diffusion layer 2 must be formed so as to have enough depth from the major surface of the substrate 1. However, a deep diffusion layer makes higher integration or element micropatterning difficult.

On the other hand, in formation of an element structure, such as the diode described above, that is, a p-n junction structure having an n-type diffusion layer in a p-type diffusion layer, a difference between diffusion lengths caused by a difference of diffusion coefficients between boron as a p-type impurity and arsenic as an n-type impurity is utilized. In general, the diffusion coefficient of boron is higher than that of arsenic. Therefore, after boron ions and arsenic ions are implanted in the major surface region of the substrate 1, both ions are simultaneously thermally diffused to form the p-type diffusion layer 2 and the n-type diffusion layer 3. A temperature or a time period of thermal diffusion is set depending on design dimensions of the p-type diffusion layer 2. Therefore, it is not preferable to form the n-type diffusion layer 3 having a small depth from the substrate 1 or a high impurity concentration. As a result, satisfactory element micropatterning cannot be performed.

SUMMARY OF THE INVENTION

It is therefore an object of the present invention to provide a diode capable of allowing element micropatterning.

The object of the present invention can be achieved by a diode comprising an impurity diffusion layer of a first conductivity type formed in a semiconductor body, an insulating film formed on the semiconductor body, an opening portion formed in the insulating film at a position corresponding to the impurity diffusion layer, and a semiconductor layer of a second conductivity type formed inside the opening portion and having a junction with the impurity diffusion layer, the junction being positioned on or above a major surface of the semiconductor body.

In such a structure, since the impurity diffusion layer is separately formed in the semiconductor body, it can be made shallow. Since the semiconductor layer is formed on the semiconductor body, it can be made thick, and can have a high impurity concentration. Therefore, a diode capable of allowing element micropatterning can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a structure of a conventional diode;

FIG. 2 is a circuit diagram showing an arrangement of a DRAM reference potential generating circuit employing a diode according to the present invention;

FIG. 3 is a circuit diagram showing another arrangement of a DRAM reference potential generating circuit employing a diode according to the present invention;

FIGS. 6A, 6B, 6C and 6D are sectional views for explaining the steps in manufacturing a diode according to the third embodiment of the present invention; and FIG. 7 is a sectional view showing a structure of a diode according to the fourth embodiment of the present invention.

DETAILED DESCRIPTION OF THE PREFERRED EMBODIMENTS

Figure 4:
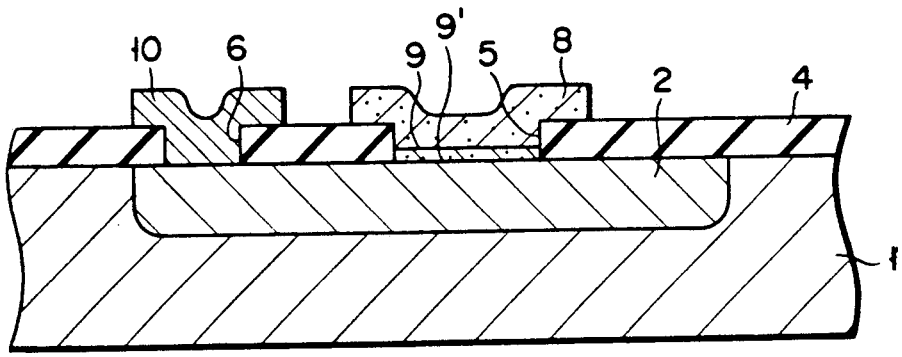
FIG. 4 is a sectional view showing a structure of a diode according to the first embodiment of the present invention.

A DRAM reference potential generating circuit employing diodes according to the present invention is shown in FIG. 2. A power source $V_{CC}$ is connected to one terminal of a constant current source 30, and the anode of a first diode 31 is connected to the other terminal of the constant current source 30. The anode of a second diode 32 is connected to the cathode of the diode 31. A ground point $V_{SS}$ is connected to the cathode of the diode 32. A reference potential $V_{ref}$ is output from a connection node CN of the other terminal of the constant current source 30 and the anode of the diode 31. The reference potential $V_{ref}$ is a sum of forward dropping voltages of the diodes 31 and 32. When the forward dropping voltages of the diodes 31 and 32 are represented by $V_F$, the reference potential is given by $V_{ref}=2V_F$. The reference potential $V_{ref}$ can be set as a multiple of VF by changing the number of diodes connected in series in accordance with a required level. A load element such as a resistor may be arranged, as needed, between the anode of the diode 32 the and ground point $V_{SS}$, between the cathode of the diode 31 and the anode of the diode 32, and between the node CN and the anode of the diode 31 or the like.

FIG. 3 shows a circuit obtained by improving the reference potential generating circuit shown in FIG. 2. More specifically, in the circuit shown in FIG. 2, a current path of a first switching MOS transistor 33 is connected between the other terminal of the constant current source 30 and the node CN, and a current path of a second switching MOS transistor 34 is connected between the cathode of the diode 32 and the ground point $V_{SS}$. A control signal CS is supplied to the gates of the MOS transistors 33 and 34. The control signal CS causes the MOS transistors 33 and 34 to turn on when the reference potential $V_{ref}$ is output, and turn off when the reference potential $V_{ref}$ is not output.

In contrast to the reference potential generating circuit shown in FIG. 2 in which a through current always flows from the power source $V_{CC}$ to the ground point $V_{SS}$, the reference potential generating circuit having the arrangement structure shown in FIG. 3 can be rendered active by the control signal CS as needed. Therefore, wasteful consumption of a current is reduced, and an arrangement having low power consumption can be obtained.

A structure of the diode in the circuits in FIGS. 2 and 3 is shown in FIG. 4. As shown in FIG. 4, in a major surface region of e.g., an n-type silicon substrate 1, a p-type diffusion layer 2 containing boron ions as a p-type impurity is formed. The p-type diffusion layer serves as the anode region of the diode. The p-type diffusion layer 2 has a depth of about 0.3 μm from the major surface of the substrate 1, and an impurity concentration of $10^{19}$ atoms·cm$^{-3}$ or more (not less than $10^{19}$ atoms·cm$^{-3}$). On the substrate 1, an insulating film 4 having a thickness of about 1 to 2 μm is formed. In the insulating film 4, first and second contact holes 5 and 6 are formed in part of a region on the p-type diffusion layer 2 and spaced apart from each other by a predetermined distance. In the first contact hole 5 among these contact holes 5 and 6, and on the insulating film 4 around the contact hole 5, an n-type arsenic-containing polysilicon layer 8 (an impurity concentration of $10^{19}$ atoms·cm$^{-3}$ or more) is formed in contact with the p-type diffusion layer 2. The polysilicon layer 8 serves as the cathode region of the diode. The diode is constituted by the p-type diffusion layer 2 and the n-type polysilicon layer 8. In the n-type polysilicon layer 8, a p-n junction 9 is formed by boron ions diffused upward from the p-type diffusion layer 2 in a step of forming the layer 8. It is preferred that the p-n junction coincides with the major surface of the substrate 1 (denoted by reference numeral 9'), or a position above the major surface in the polysilicon layer 8. In the second contact hole 6 and on the insulating film 4 around the contact hole 6, a wiring pattern 10 consisting of e.g., aluminum is formed in contact with the p-type diffusion layer 2.

In the diode having such a structure, the p-n junction 9 between the p-type diffusion layer 2 formed in the substrate 1 and the n-type polysilicon layer 8 formed on the substrate 1 is formed in the polysilicon layer 8 (or to coincide with the major surface of the substrate 1). In addition, the p-type diffusion layer 2 is separately formed in the substrate 1. For these reasons, the depth of the p-type diffusion layer 2 can be set independently of dimensions of the n-type diffusion layer different from those of a conventional diffusion layer.

Note that, in the above embodiment, the p-type diffusion layer 2 has a depth of 0.3 μm in the same manner as a conventional layer. However, it can obviously have a smaller depth.

A diode according to the second embodiment of the present invention will be described with reference to FIGS. 5A to 5E. FIGS. 5A to 5E show sectional views showing the steps in manufacturing the diode.

Figure 5A:
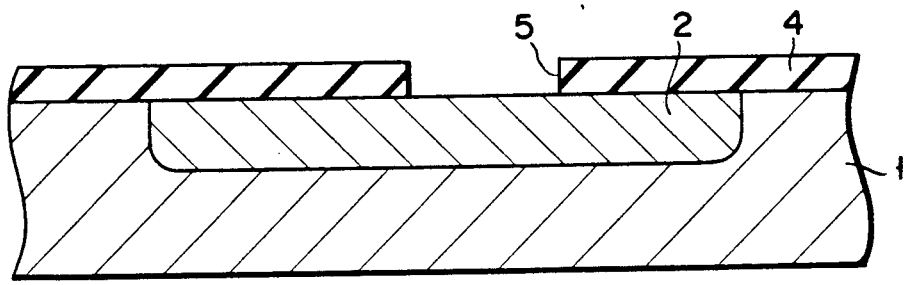
FIGS. 5A, 5B, 5C, 5D and 5E are sectional views for explaining the steps in manufacturing a diode according to the second embodiment of the present invention.

As shown in FIG. 5A, in a major surface region of an n-type silicon substrate, a p-type diffusion layer 2 having a depth of about 0.3 μm is formed. The diffusion layer 2 is formed as follows. A mask is formed on the substrate 1 by photolithography utilizing a photoresist. After boron ions are selectively implanted into the substrate 1 using the mask, annealing is performed to diffuse boron ions. In this manner, the diffusion layer 2 is formed. Next, an insulating film 4, which consists of an oxide film, a BPSG (borophosphosilicate glass) film, or the like, and has a thickness of 1 to 2 μm, is formed on the substrate 1 by CVD (Chemical Vapor Deposition). In the insulating film 4, a contact hole 5 is formed in part of a region on the diffusion layer 2 by photolithography and RIE (Reactive Ion Etching).

Figure 5B:
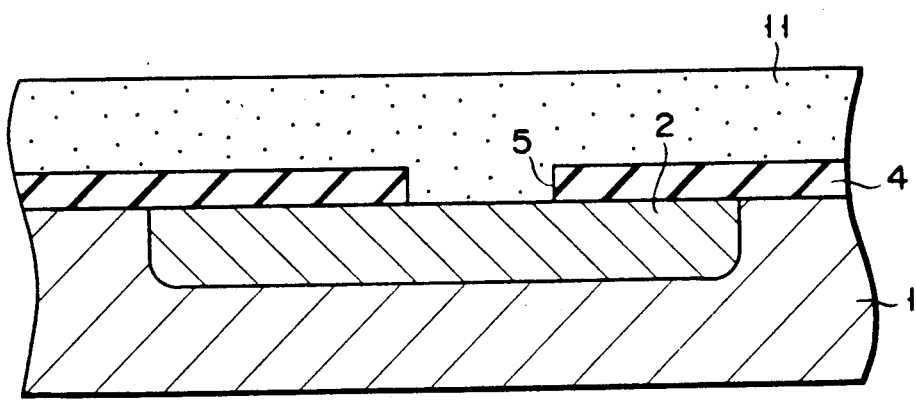

As shown in FIG. 5B, a polysilicon layer 11 is deposited on the resultant structure by CVD. The polysilicon layer 11 is formed to have a thickness larger than the radius of the contact hole 5 so as to entirely fill polysilicon inside the contact hole 5.

Figure 5C:
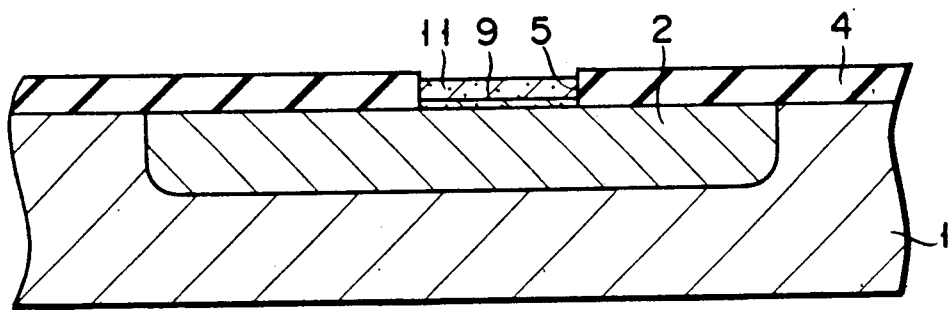

As shown in FIG. 5C, the resultant structure is etched back by the thickness of the polysilicon layer 11, in other words, until the surface of the insulating film 4 is exposed, by, e.g., RIE. As a result, the polysilicon layer 11 is left only inside the contact hole 5, and the contact hole 5 is embedded with the polysilicon layer 11. Next, by using a mask formed by photolithography, arsenic as an n-type impurity is selectively ion-implanted in the polysilicon layer 11 embedded in the contact hole 5 at an acceleration voltage of 60 keV and a dose of $10^{16}$ ions·cm$^{-2}$. Then, the polysilicon layer is converted to an n-type layer by annealing. During annealing, the implanted arsenic ions are diffused downward in the polysilicon layer 11. At the same time, boron ions of a high diffusion coefficient (as the p-type impurity) contained in the p-type diffusion layer 2 are diffused upward in the polysilicon layer 11. As a result, a p-n junction 9 is formed in the polysilicon layer 11.

Figure 5D:
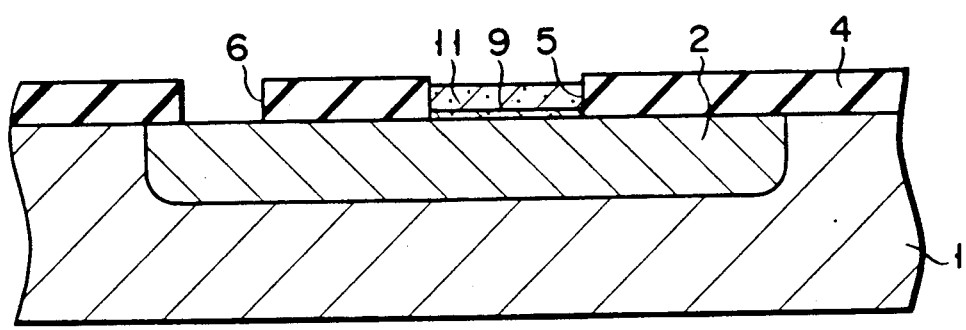

As shown in FIG. 5D, in the insulating film 4, a contact hole 6 is formed in part of a region on the diffusion layer 2 and is spaced apart from the contact hole 5. The contact hole 6 is formed as follows. On the insulating film 4, a mask is formed by photolithography utilizing a photoresist. The insulating film 4 is selectively etched back by RIE using the mask. In this manner, the contact hole 6 is formed.

Figure 5E:
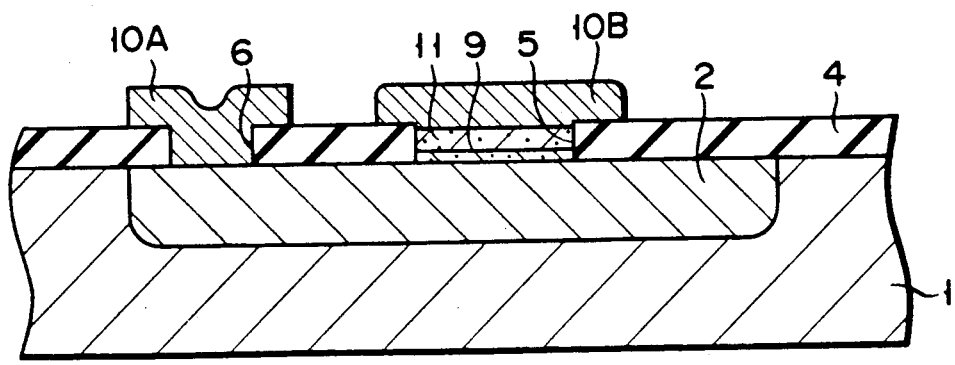

As shown in FIG. 5E, an aluminum film is deposited on the resultant structure by sputtering. The aluminum film is patterned by photolithography to form wiring patterns 10A and 10B.

As described above, the n-type polysilicon layer 11 constituting the cathode of the diode may be formed to be entirely embedded in the contact hole 5. Since the depth of the contact hole 5 is about 1 to 2 μm, which is equal to the thickness of the insulating film 4, and the thickness of the n-type polysilicon layer 11 can be arbitrarily set within the range of 1 to 2 μm, the polysilicon layer 11 can have a sufficiently large thickness not to cause an aluminum spike. In addition, as in the first embodiment, the depth of the p-type diffusion layer 2 can be set independently of the depth of the n-type diffusion layer (the thickness of the n-type polysilicon layer 11). In the above description, the depth of the p-type diffusion layer 2 is set to be about 0.3 μm. However, there is no problem to form a shallower diffusion layer 2 if it is possible in the subsequent manufacturing steps.

A diode according to the third embodiment of the present invention will be explained with reference to FIGS. 6A to 6D. FIGS. 6A to 6D show sectional views showing the steps in manufacturing the diode.

As shown in FIG. 6A, a p-type diffusion layer 2 having a depth of 0.3 μm is formed in a major surface region of an n-type silicon substrate 1. The diffusion layer 2 is formed as follows. A mask is formed on the substrate 1 by photolithography. After boron ions are selectively implanted using the mask, boron ions are thermally diffused. In this manner, the diffusion layer 2 is formed. Next, an insulating film 4, which consists of an oxide film, a BPSG film, or the like and has a depth of 1 to 2 μm is formed on the substrate 1 by CVD. In the insulating film 4, a contact hole 5 is formed at part of a region on the diffusion layer 2. The contact hole 5 is formed as follows. After a mask is formed on the insulating film 4 by photolithography, the insulating film 4 is selectively removed by RIE. In this manner, the contact hole 5 is formed.

Then, as shown in FIG. 6B, a single-crystal silicon layer 12 is grown only inside the contact hole 5 by SEG (Selective Epitaxial Growth). In the single-crystal silicon layer 12 embedded inside the contact hole 5, arsenic ions as an n-type impurity are selectively implanted at an acceleration voltage of 60 keV, and a dose of $1 \times 10^{16}$ ions·cm$^{-2}$. The selective ionimplantation is performed by ion-implantation of arsenic using a mask formed by photolithography. Then, annealing is performed to convert the single-crystal silicon layer 12 to an n-type layer. During the annealing, the implanted arsenic ions are diffused downward in the single-crystal silicon layer 12. At the same time, boron ions of a high diffusion coefficient contained in the p-type diffusion layer 2 are diffused upward in the single-crystal layer 12. As a result, by the difference between diffusion coefficients of these impurities, a p-n junction 9 is formed in the single-crystal silicon layer 12.

As shown in FIG. 6C, in the insulating film 4, a contact hole 6 is formed at part of a region on the diffusion layer 2 and is spaced apart from the contact hole 5. The contact hole 6 is formed as follows. A mask is formed by photolithography, and the insulating film 4 is selectively etched back by RIE utilizing the mask. In this manner, the contact hole 6 is formed.

As shown in FIG. 6D, an aluminum film is then deposited on the resultant structure. The aluminum film is patterned by photolithography to form wiring patterns 10A and 10B.

In this manner, the same effect as the first and second embodiments can be obtained even if the cathode region of the diode embedded in the contact hole 5 is not polysilicon but single-crystal silicon.

The fourth embodiment of the present invention will be described with reference to FIG. 7.

The fourth embodiment shows that the present invention can be applied to a diffusion layer, as an anode region of a diode not formed in a silicon substrate 1 as shown in the first to third embodiments, but formed in polysilicon formed on an insulating film.

An insulating film 14 is formed on a silicon substrate 13. An n-type polysilicon layer 15, which contains arsenic ions as an n-type impurity and has a thickness of about 0.3 μm, is formed on the insulating film 14. In the n-type polysilicon layer 15, a p-type diffusion layer 16 containing boron ions as a p-type impurity is formed. The p-type diffusion layer 16 has an impurity concentration of $10^{19}$ atoms·cm$^{-3}$, and the boron ions are diffused to a depth reaching the insulating film 14. On the n-type polysilicon layer 15, an insulating film 17 having a thickness of 1 to 2 μm is formed. In the insulating film 17, first and second contact holes 18 and 19 are formed in parts corresponding to the p-type diffusion layer 16 and are spaced apart from each other. In the first contact hole 18 among these two contact holes 18 and 19, an n-type arsenic-containing polysilicon layer 20 is formed in contact with the p-type diffusion layer 16. In the polysilicon layer 20, a p-n junction 9 is formed by boron diffused upward from the p-type diffusion layer 16 during formation of the layer 20. On the other hand, in the second contact hole 19 and on the insulating film 17 around the contact hole 19, a wiring pattern 21 consisting of aluminum is formed in contact with the p-type diffusion layer 16.

As described above, the present invention can be applied to the diffusion layer which is not formed in the silicon substrate. The present invention can be applied to a multi-layered device as a highly integrated structure of the semiconductor device, thus further improving micropatterning.

In the fourth embodiment, the n-type polysilicon layer 15 may be polysilicon, or single-crystal silicon obtained by annealing polysilicon with a laser. The polysilicon layer 20 may be embedded inside the contact hole 18 as in the second embodiment described above.

The present invention is not limited to the above-described embodiments, and various applications and modifications can be performed. This will be described below.

Although diodes are exemplified in the first to fourth embodiments, the present invention can be applied to other semiconductor elements each having a junction between a p-type diffusion layer and an n-type diffusion layer both having high impurity concentrations to provide a useful effect for element micropatterning.

Although arsenic and boron ions are respectively used as n-type and p-type impurities in the first to fourth embodiments, impurities defining conductivity types are not limited to these two elements. For example, phosphorus or antimony can be used as an n-type impurity. Moreover, the conductivity types of n-type and p-type diffusion layers can be reversed. For example, a p-type silicon substrate can be used instead of the n-type silicon substrate 1 in FIG. 4, the p-type diffusion layer 2 can be replaced with an n-type diffusion layer, and the n-type polysilicon layer 8 can be replaced with a p-type polysilicon layer.

In addition, in the manufacturing steps explained in the second and third embodiments, ion implantation is used as a doping method for the polysilicon layer 11 or the single-crystal silicon layer 12. However, various other methods can be used in place of ion implantation. Note that, when the semiconductor device (diode) according to the present invention and a CMOS semiconductor device are formed on a single chip, ion implantation is most suitable as a means for doping an impurity.

What is claimed is:

1. A semiconductor integrated circuit device, comprising:
    a semiconductor substrate having a surface;
    an impurity diffusion layer of a first conductivity type formed in said semiconductor substrate and extending below said surface of said semiconductor substrate;
    an insulating film formed on said surface of said semiconductor substrate;
    a first opening formed in said insulating film at a first position corresponding to said impurity diffusion layer; and
    a layer of a second conductivity type formed in said first opening, wherein a PN junction is formed between said layer of a second conductivity type and said impurity diffusion layer, said PN junction being formed at or above a level of said surface of said semiconductor substrate.

2. A device according to claim 1, further comprising:
    a second opening formed in said insulating film at a second position corresponding to said impurity diffusion layer; and
    a conductive layer formed in said second opening.

3. A device according to claim 1, wherein the respective impurity concentrations of said impurity diffusion layer and said layer of a second conductivity type are at least $10^{19}$ cm$^{-3}$.

4. A device according to claim 1, wherein the depth of said impurity diffusion layer from said surface of said semiconductor substrate is 0.3 $\mu$m or less.

5. A device according to claim 1, wherein said semiconductor substrate comprises a silicon substrate of the second conductivity type.

6. A device according to claim 1 further comprising:
    a metal layer formed on said layer of a second conductivity type.

7. A device according to claim 1, wherein said impurity diffusion layer and said layer of a second conductivity type comprise a diode.

8. A device according to claim 7, wherein said diode generates a reference potential for use in a DRAM.

9. A device according to claim 1, wherein said layer of a second conductivity type comprises a polysilicon layer.

10. A device according to claim 1, wherein said layer of a second conductivity type comprises a single crystalline silicon layer.

11. A semiconductor integrated circuit device, comprising:
    a semiconductor substrate;
    a first insulating film formed on said semiconductor substrate;
    a first polysilicon layer of a first conductivity type formed on said first insulating film and having a surface;
    an impurity diffusion layer of a second conductivity type formed in said first polysilicon layer and extending below said surface of said first polysilicon layer;
    a second insulating film formed on said first polysilicon layer;
    a first opening formed in said second insulating film at a first position corresponding to said impurity diffusion layer; and
    a second polysilicon layer of the first conductivity type formed in said first opening, wherein a PN junction is formed between said second polysilicon layer and said impurity diffusion layer, said PN junction being formed at or above a level of said surface of said first polysilicon layer.

12. A device according to claim 11 further comprising:
    a second opening formed in said second insulating film at a second position corresponding to said impurity diffusion layer; and
    a conductive layer formed in said second opening.

13. A device according to claim 11, wherein the respective impurity concentrations of said impurity diffusion layer and said second polysilicon layer are at least $10^{19}$ cm$^{-3}$.

14. A device according to claim 11, wherein the depth of said impurity diffusion layer from said surface of the first polysilicon layer is 0.3 $\mu$m or less.

15. A device according to claim 11, wherein said impurity diffusion layer and said second polysilicon layer comprise a diode.

16. A device according to claim 15, wherein said diode generates a reference potential for use in a DRAM.

* * * * *